United States Patent
Ishinabe

(10) Patent No.: US 10,064,313 B2
(45) Date of Patent: Aug. 28, 2018

(54) INFORMATION PROCESSING SYSTEM AND CONTROL METHOD FOR INFORMATION PROCESSING SYSTEM

(71) Applicant: FUJITSU LIMITED, Kawasaki-shi, Kanagawa (JP)

(72) Inventor: Minoru Ishinabe, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/712,191

(22) Filed: Sep. 22, 2017

(65) Prior Publication Data

US 2018/0098464 A1    Apr. 5, 2018

(30) Foreign Application Priority Data

Oct. 4, 2016 (JP) ................................. 2016-196381

(51) Int. Cl.
*H05K 7/20*      (2006.01)

(52) U.S. Cl.
CPC ..... *H05K 7/20781* (2013.01); *H05K 7/20236* (2013.01); *H05K 7/20263* (2013.01); *H05K 7/20272* (2013.01); *H05K 7/20736* (2013.01); *H05K 7/20836* (2013.01)

(58) Field of Classification Search
CPC ........... H05K 7/20781; H05K 7/20236; H05K 7/20263; H05K 7/20272; H05K 7/20836; H05K 7/2079; H05K 7/20772; H05K 7/203; H05K 7/20827; H05K 7/20318; H05K 7/20818; H05K 7/20; H05K 7/20763; H05K 7/20145; H05K 7/20218; H05K 7/20281; H05K 7/2039; H05K 7/20745; H05K 7/1497; H05K 7/20327; H05K 7/20381; G06F 1/20; G06F 1/206; G06F 2200/201

See application file for complete search history.

(56) References Cited

U.S. PATENT DOCUMENTS

| | | | |
|---|---|---|---|
| 5,099,651 A * | 3/1992 | Fischer | F24D 15/04 62/160 |
| 9,404,679 B2 * | 8/2016 | Ito | F25B 39/02 |
| 9,844,166 B2 * | 12/2017 | Shelnutt | H05K 7/20281 |
| 2003/0042361 A1 * | 3/2003 | Simadiris | B64D 11/04 244/118.5 |

(Continued)

FOREIGN PATENT DOCUMENTS

| | | |
|---|---|---|
| JP | 5-160310 | 6/1993 |
| JP | 2011-518395 | 6/2011 |

*Primary Examiner* — James Wu
*Assistant Examiner* — Michael Matey
(74) *Attorney, Agent, or Firm* — Fujitsu Patent Center

(57) ABSTRACT

An information processing system includes a chiller configured to cool a primary refrigerant; a liquid immersion tank in which a processing device including a first electronic component is immersed in a secondary refrigerant; a second electronic component coupled to the processing device; a blower configured to blow or inhale air for the second electronic component; a coil in which the secondary refrigerant is cooled by the air; an air tank that is coupled to the coil and that includes a refrigerant pipe through which the secondary refrigerant flows; a heat exchanger configured to exchange heat between the primary refrigerant and the secondary refrigerant; and a pump configured to circulate the secondary refrigerant from the liquid immersion tank to the heat exchanger.

14 Claims, 10 Drawing Sheets

(56) References Cited

U.S. PATENT DOCUMENTS

| | | | |
|---|---|---|---|
| 2009/0260777 A1 | 10/2009 | Attlesey | |
| 2011/0271695 A1* | 11/2011 | Kashirajima | G06F 1/206 62/62 |
| 2013/0021746 A1* | 1/2013 | Campbell | H05K 7/20145 361/679.47 |
| 2014/0218858 A1* | 8/2014 | Shelnutt | G06F 1/206 361/679.31 |
| 2014/0362527 A1* | 12/2014 | Best | G06F 1/20 361/679.53 |
| 2015/0292820 A1* | 10/2015 | Katoh | F25B 39/04 165/140 |
| 2016/0054033 A1* | 2/2016 | Matsuura | F25B 1/10 62/498 |
| 2016/0128232 A1* | 5/2016 | Chainer | H01L 23/3735 361/700 |

\* cited by examiner

INFORMATION PROCESSING SYSTEM AND CONTROL METHOD FOR INFORMATION PROCESSING SYSTEM

CROSS-REFERENCE TO RELATED APPLICATION

This application is based upon and claims the benefit of priority of the prior Japanese Patent Application No. 2016-196381, filed on Oct. 4, 2016, the entire contents of which are incorporated herein by reference.

FIELD

The embodiments discussed herein are related to an information processing system and a control method for the information processing system.

BACKGROUND

In recent years, it has been desirable that electronic devices such as servers or storages are densely implemented in a data center. On the other hand, the amount of heat generation of the electronic devices has increased with an increase in speed of the electronic devices.

In a case where electronic devices each having a large amount of heat generation are densely implemented, temperatures of the electronic devices exceed allowable upper-limit temperatures and cause an incorrect operation or a failure. Therefore, cooling methods each capable of fully cooling electronic devices each having a large amount of heat generation even in a case where the electronic devices are densely implemented are requested.

As one of such cooling methods, it is proposed that an electronic device is immersed in a liquid refrigerant and is cooled. Hereinafter, this type of cooling method will be called a liquid immersion cooling method. In the liquid immersion cooling method, an inactive liquid refrigerant having a high insulation property (a fluorocarbon compound, for example) is put into a liquid immersion tank, and an electronic device is immersed in the refrigerant, thereby circulating the refrigerant between the liquid immersion tank and a heat exchanger.

In the liquid immersion cooling method, it is proposed that an electronic device having a large amount of heat generation and an electronic device having a small amount of heat generation are immersed in refrigerants of respective different liquid immersion tanks (see, for example, Japanese Laid-open Patent Publication No. 5-160310 and so forth). Furthermore, it is proposed that a heat sink is attached to an element having a large amount of heat generation and the relevant heat sink is cooled by a dielectric coolant (see, for example, Japanese National Publication of International Patent Application No. 2011-518395 and so forth).

In general, in an information processing system, hard disks are used as external storage devices. Each of general hard disks is designed on the premise of being used in the atmosphere, and in a chassis thereof, vent holes for connecting between a space within the chassis and the outside thereof are provided. The reason is that an increase in pressure within the chassis, caused by heat generated along with an operation, is kept from deteriorating both a write characteristic and a read characteristic.

In a case where this type of hard disk is immersive in a refrigerant, the refrigerant enters the chassis from the vent holes, and surfaces of disks are covered by the refrigerant, thereby disabling reading and writing of data. Accordingly, it is difficult for this type of hard disk to be immersed in the refrigerant and to be used. This type of hard disk is an example of electronic components each having low liquid immersion resistance.

It is conceivable that, as a storage, a solid stare drive (SSD) or a hard disk filled with helium gas (hereinafter, called a He-filled hard disk drive (HDD)) is used. Since being hermetically sealed, the SSD and the He-filled HDD each have high liquid immersion resistance and are able to be immersed in the refrigerant and be used.

However, the SSD and the He-filled HDD have high production costs, compared with the above-mentioned general hard disks. Many storages are used in the data center. Therefore, in a case of using the SSDs or the He-filled HDDs, a construction cost of the information processing system is greatly elevated. In view of the above, it is desirable that, by using a liquid refrigerant, it is possible to cool an electronic component having low liquid immersion resistance in addition to an electronic component having high liquid immersion resistance.

SUMMARY

According to an aspect of the invention, an information processing system includes a chiller configured to cool a primary refrigerant; a liquid immersion tank in which a processing device including a first electronic component is immersed in a secondary refrigerant; a second electronic component coupled to the processing device; a blower configured to blow or inhale air for the second electronic component; a coil in which the secondary refrigerant is cooled by the air; an air tank that is coupled to the coil and that includes a refrigerant pipe through which the secondary refrigerant flows; a heat exchanger configured to exchange heat between the primary refrigerant and the secondary refrigerant; and a pump configured to circulate the secondary refrigerant from the liquid immersion tank to the heat exchanger.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to attached drawings.

First Embodiment

Figure 1:
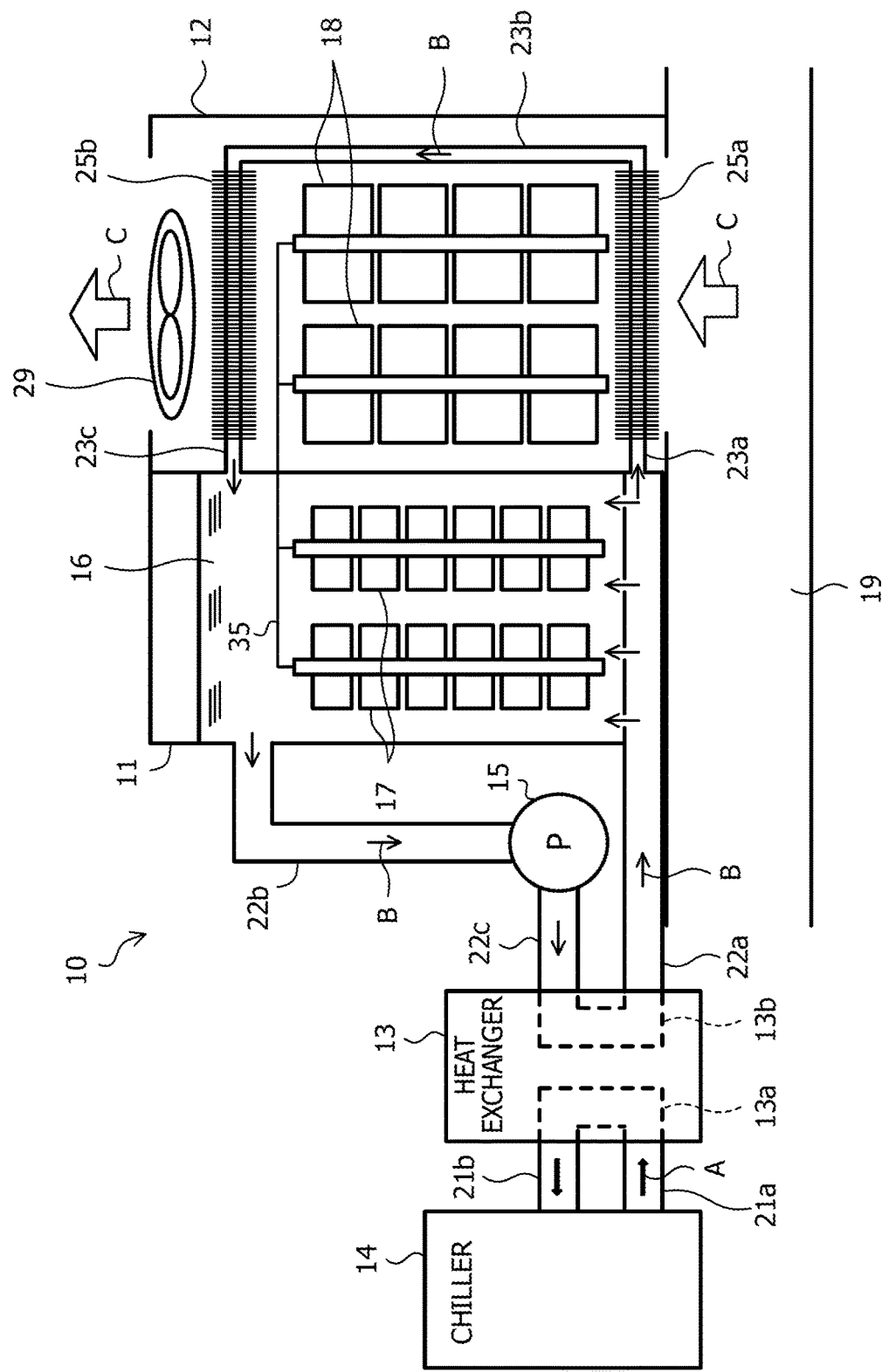
FIG. 1 is a pattern diagram illustrating an information processing system according to a first embodiment.

FIG. 1 is a pattern diagram illustrating an information processing system according to a first embodiment. In FIG. 1, an arrow A indicates a flow direction of cooling water, arrows B each indicate a flow direction of a refrigerant, and arrows C each indicate a flow direction of air.

As illustrated in FIG. 1, an information processing system 10 according to the present embodiment includes a liquid immersion tank 11, an air-cooling tank 12, a heat exchanger 13, a chiller 14, and a pump 15. Under the floor of a room in which the liquid immersion tank 11 and the air-cooling tank 12 are installed, a space (hereinafter, called a "free space 19") through which low-temperature air having a temperature managed by a package air conditioner (not illustrated) flows is provided.

The chiller 14 is installed outside. While, in the present embodiment, the heat exchanger 13 and the pump 15 are installed in the same room as that of the liquid immersion tank 11 and the air-cooling tank 12, the heat exchanger 13 and the pump 15 may be installed outside.

A liquid refrigerant 16 is put into the liquid immersion tank 11. Server bricks 17 are immersed in the refrigerant 16. As the refrigerant 16, a fluorocarbon compound (Fluorinert (registered trademark) manufactured by 3M Company, for example), oil (polyalphaolefin (PAO), for example), or the like may be used.

Refrigerant inlets are provided in a bottom portion of the liquid immersion tank 11, and a refrigerant outlet is provided in an upper portion thereof. As described later, the low-temperature refrigerant 16 is supplied into the liquid immersion tank 11 by the heat exchanger 13 via the refrigerant inlets. The high-temperature refrigerant 16 in the liquid immersion tank 11 is sucked out from the refrigerant outlet by the pump 15 and is transported to the heat exchanger 13.

Figure 2:
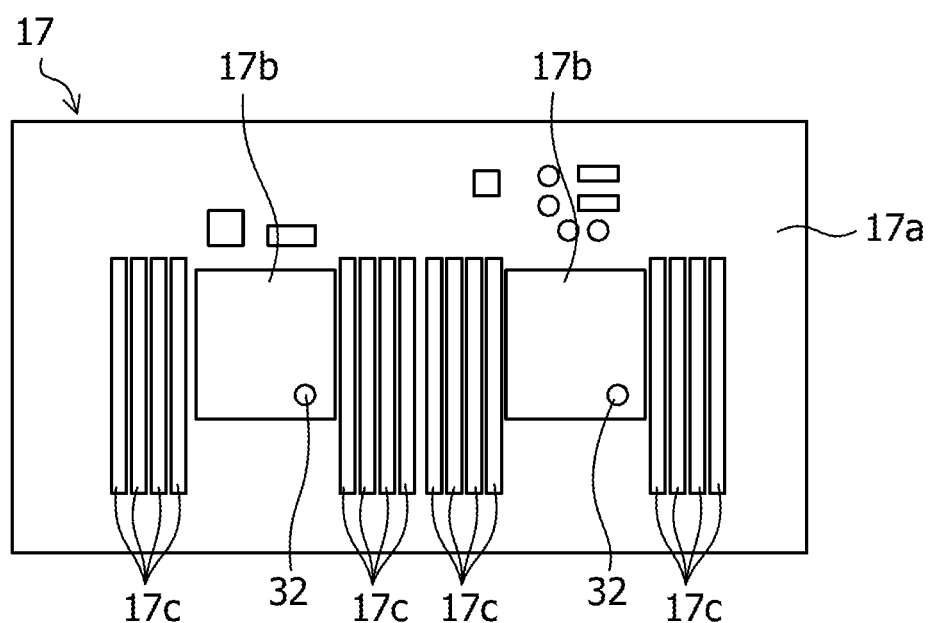
FIG. 2 is a schematic plan view illustrating a server brick.

As illustrated in FIG. 2, server bricks 17 each include a board 17a and electronic components such as central processing units (CPUs) 17b and memories 17c mounted in the board 17a. In each of the server bricks 17, temperature sensors 32 to detect temperatures of electronic components (the CPUs 17b in the example of FIG. 2) are provided. Here, each of electronic components such as the CPUs 17b and the memories 17c mounted in the board 17a is an electronic component having high liquid immersion resistance. Each of the server bricks 17 is an example of a processing device. Each of the CPUs 17b and the memories 17c is an example of a first electronic component.

The air-cooling tank 12 is installed adjacent to the liquid immersion tank 11. Storage bricks 18 are arranged within the air-cooling tank 12.

Figure 3:
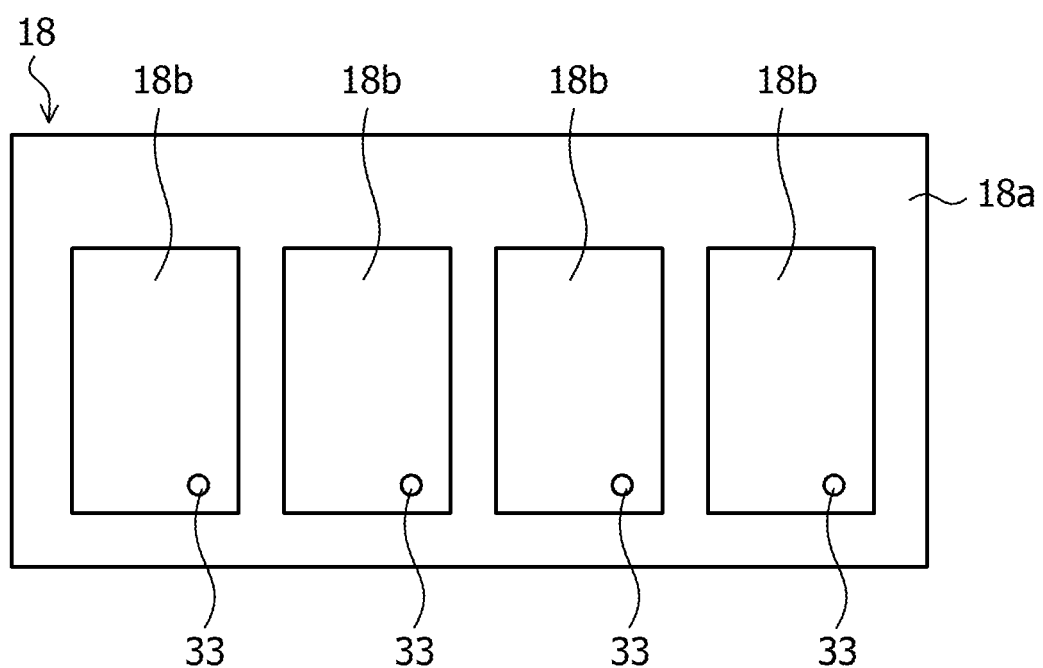
FIG. 3 is a schematic plan view illustrating a storage brick.

As illustrated in FIG. 3, the storage bricks 18 each include a board 18a and hard disks 18b coupled to the board 18a. In each of the storage bricks 18, temperature sensors 33 to detect temperatures of the respective hard disks 18b are provided. In the present embodiment, as each of the hard disks 18b, a general hard disk in a chassis of which vent holes are provided is used. Each of the hard disks 18b is an example of a second electronic component.

The server bricks 17 and the storage bricks 18 (the hard disks 18b) are electrically coupled by a cable 35.

In a bottom portion of the air-cooling tank 12, a hole into the free space 19 is provided as illustrated in FIG. 1. A cooling coil 25a is arranged in a lower portion of the air-cooling tank 12, and a cooling coil 25b is arranged in an upper portion thereof. The storage bricks 18 are arranged between the cooling coil 25a and the cooling coil 25b.

A blower 29 is arranged above the cooling coil 25b. Low-temperature air is introduced from the free space 19 into the air-cooling tank 12 by the blower 29. The position of the blower 29 is not limited to a position located above the cooling coil 25b and may be a position at which cold air is able to be blown or inhaled into the air-cooling tank 12.

Figure 4:
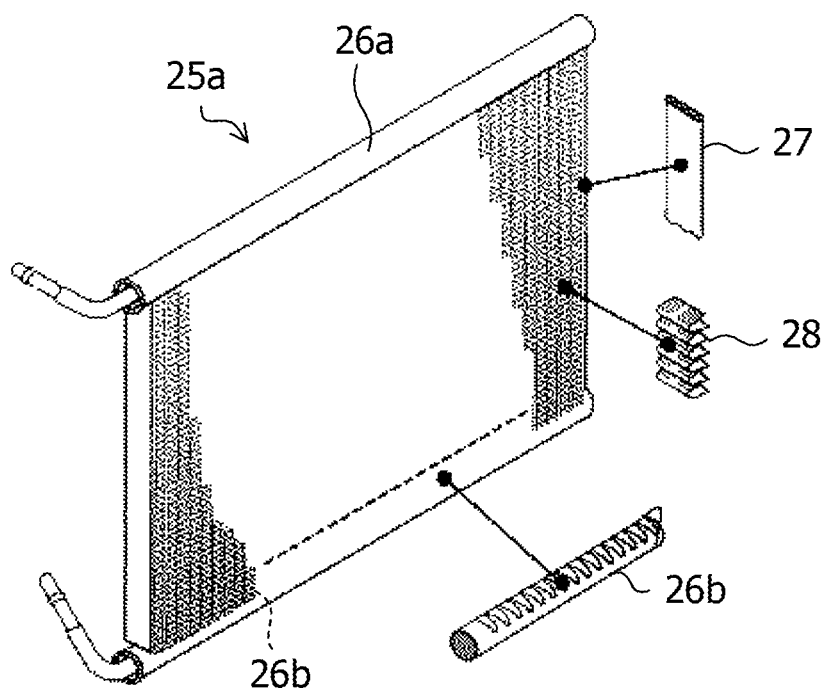
FIG. 4 is a perspective view illustrating a cooling coil.

FIG. 4 is a perspective view illustrating the cooling coil 25a (reference source: NIKKEI HEAT EXCHANGER COMPANY, LTD., [searched on Sep. 30, 2016], the Internet (URL:http://group.nikkeikin.co.jp/nex/product/post.html)). Since the cooling coil 25b has the same shape as that of the cooling coil 25a, an illustration and a description of the cooling coil 25b will be omitted here.

The cooling coil 25a illustrated in FIG. 4 includes two header pipes 26a and 26b arranged in parallel to each other, flat pipes 27 for connecting between these header pipes 26a and 26b, and corrugated fins 28 arranged between the flat pipes 27.

As illustrated in FIG. 1, the header pipe 26a of the cooling coil 25a, arranged in a lower portion of the air-cooling tank 12, is coupled to a lower portion of the liquid immersion tank 11 via a pipe 23a. The header pipe 26b of the cooling coil 25a and the header pipe 26a of the cooling coil 25b are coupled to each other by a pipe 23b. The header pipe 26b of the cooling coil 25b is coupled to an upper portion of the liquid immersion tank 11 via a pipe 23c.

The pipes 23a, 23b, and 23c correspond to an example of a refrigerant pipe. FIG. 4 illustrates examples of the cooling coils 25a and 25b, and the shapes of the cooling coils 25a and 25b are not limited to these illustrated in FIG. 4. In a case where the package air conditioner or the like supplies, to the free space 19, air having a managed temperature, the cooling coil 25a in the lower portion of the air-cooling tank 12 may be omitted.

As illustrated in FIG. 1, the heat exchanger 13 includes a cooling water flow path 13a through which the cooling water flows, and a refrigerant flow path 13b through which the refrigerant 16 flows.

An inlet of the cooling water flow path 13a is coupled to a cooling water outlet of the chiller 14 via a pipe 21a. A cooling water inlet of the chiller 14 is coupled to an outlet of the cooling water flow path 13a via a pipe 21b. An outlet of the refrigerant flow path 13b is coupled to the refrigerant inlets of the liquid immersion tank 11 via a pipe 22a. Furthermore, the refrigerant outlet of the liquid immersion tank 11 is coupled to a suction opening (suction) of the pump 15 via a pipe 22b. A discharge opening (delivery) of the pump 15 is coupled to an inlet of the refrigerant flow path 13b by a pipe 22c.

In the present embodiment, the cooling water circulating between the chiller 14 and the heat exchanger 13 is an example of a primary refrigerant. The refrigerant 16 circulating between the heat exchanger 13 and the liquid immersion tank 11 is an example of a secondary refrigerant. The pump 15 is an example of a delivery device. The chiller 14 is an example of an air-conditioning device to cool the primary refrigerant.

Figure 5:
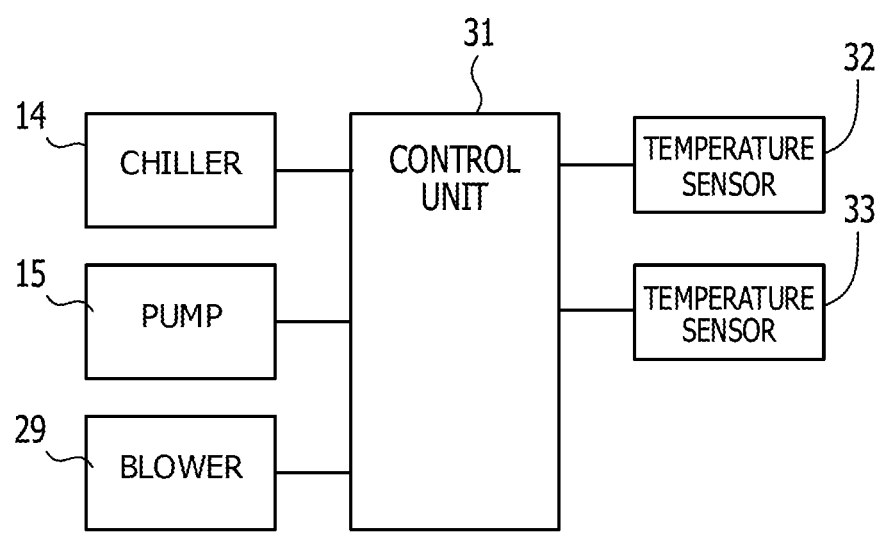
FIG. 5 is a block diagram illustrating a control system for the information processing system according to the first embodiment.

FIG. 5 is a block diagram illustrating a control system for the information processing system according to the present embodiment.

As described above, in each of the server bricks 17, the temperature sensors 32 to detect the temperatures of the respective CPUs 17b are provided. In each of the storage bricks 18, the temperature sensors 33 to detect the temperatures of the respective hard disks 18b are provided (see FIG. 2 and FIG. 3).

The control unit 31 controls the temperature of the cooling water supplied by the chiller 14, the number of rotations of the pump 15, and the number of rotations of the blower 29 so that temperatures detected by the temperature sensors 32 and the temperature sensors 33 fall within preliminarily set temperature ranges.

In a case where the temperature of one of the server bricks 17, detected by the corresponding temperature sensor 32, does not fall within a setting range, the control unit 31 controls the chiller 14, thereby changing the temperature or flow rate of the cooling water supplied to the heat exchanger 13, or controls the pump 15, thereby changing the flow rate of the refrigerant 16, for example.

In a case where the temperature of one of the storage bricks 18, detected by the corresponding temperature sensor 33, does not fall within a setting range, the control unit 31 controls the blower 29, thereby changing the flow rate of air flowing through the air-cooling tank 12.

Figure 6:
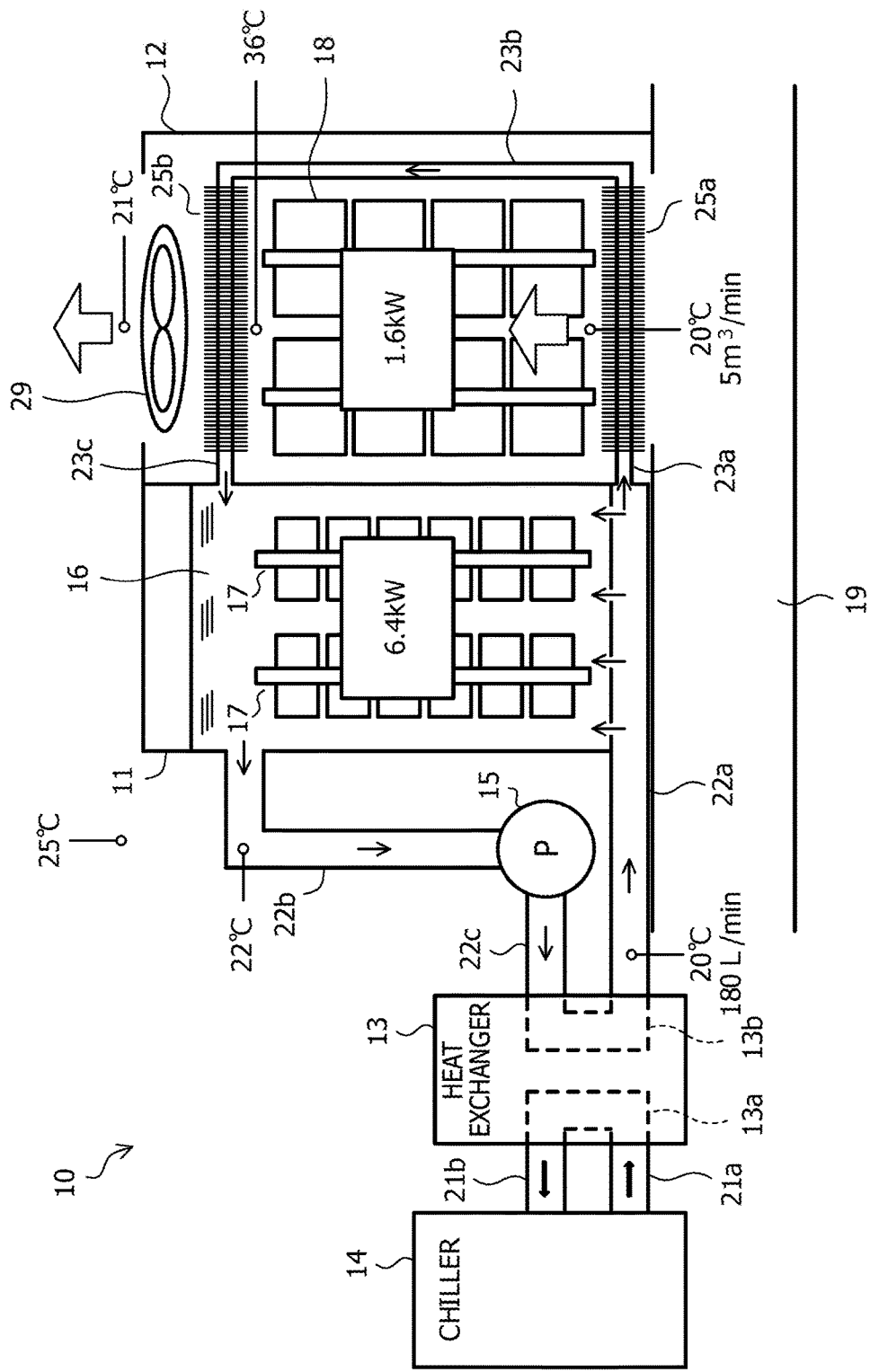
FIG. 6 is a diagram illustrating temperatures at respective portions at a time of an operation of the information processing system according to the first embodiment.

Hereinafter, an operation of the information processing system 10 will be described with reference to FIG. 6. FIG. 6 illustrates temperatures at respective portions at a time of an operation of the information processing system 10 according to the present embodiment.

As illustrated in FIG. 6, the refrigerant having a temperature of 20° C. is supplied to the liquid immersion tank 11 and the air-cooling tank 12 by the heat exchanger 13 via the pipe 22a at a flow rate of 180 liters (Ls)/min. The power consumption of the server bricks 17 arranged within the liquid immersion tank 11 is 6.4 kW (in total), and the power consumption of the storage bricks 18 arranged within the air-cooling tank 12 is 1.6 kW (in total). A flow rate of air caused by the blower 29 to flow through the air-cooling tank 12 is 5 m³/min. Furthermore, a temperature of the room in which the liquid immersion tank 11 and the air-cooling tank 12 are installed is maintained at 25° C. by the package air conditioner.

As illustrated in FIG. 6, the refrigerant 16 cooled by the heat exchanger 13 at 20° C. is supplied to the liquid immersion tank 11 and the air-cooling tank 12 via the pipe 22a.

In the liquid immersion tank 11, heat is generated along with operations of the server bricks 17, and the temperatures of the respective server bricks 17 rise. However, the server bricks 17 are cooled by the refrigerant 16 supplied via the pipe 22a. Therefore, temperatures of electronic components (the CPUs 32 and so forth) within the server bricks 17 are maintained at temperatures lower than respective allowable upper-limit temperatures. The refrigerant 16 the temperature of which rises due to cooling the server bricks 17 moves upward within the liquid immersion tank 11.

On the other hand, in the air-cooling tank 12, heat is generated along with operations of the storage bricks 18, and the temperatures of the respective storage bricks 18 rise. However, in the air-cooling tank 12, air is introduced from the free space 19 by the blower 29, and the storage bricks 18 are cooled by this air. Therefore, temperatures of electronic components (the hard disks 18b) within the storage bricks 18 are maintained at temperatures lower than respective allowable upper-limit temperatures.

At a time of passing through the cooling coil 25a, the air introduced from the free space 19 into the air-cooling tank 12 is cooled by the refrigerant 16 flowing through the cooling coil 25a. Here, it is assumed that a temperature of the air after passing through the cooling coil 25a is 20° C. By cooling the storage bricks 18, the temperature of the air rises to 36° C.

The air the temperature of which rises due to cooling the storage bricks 18 is cooled at a time of passing through the cooling coil 25b and is emitted from the air-cooling tank 12 into the room. The temperature of the air at a time of being emitted from the air-cooling tank 12 is 21° C., for example.

On the other hand, the refrigerant 16 after passing through the cooling coil 25b enters the liquid immersion tank 11 via the pipe 23c. In addition, the refrigerant 16 after passing through the cooling coil 25b joins the refrigerant 16 that cools the server bricks 17 and moves from the liquid immersion tank 11 to the heat exchanger 13 via the pipe 22b, the pump 15, and the pipe 22c. Here, it is assumed that the temperature of the refrigerant 16 passing through the pipe 22b is 22° C.

Within the heat exchanger 13, this refrigerant 16 is cooled to 20° C. by the cooling water that flows through the cooling water flow path 13a. In addition, the refrigerant 16 is supplied to the liquid immersion tank 11 and the air-cooling tank 12 via the pipe 22a again.

A difference ΔT (° C.) between the temperature of the refrigerant 16 before cooling the server bricks 17 and the temperature of the refrigerant 16 after cooling the server bricks 17 may be calculated based on the following Expression (1).

$$\Delta T = W \times 60 \times 10^3 / (L \times \rho \times C) \tag{1}$$

In this regard, however, "W" is the amount of heat generation (=power consumption (W)) of the server bricks 17, "L" is a flow rate (liters (Ls)/min) of the refrigerant 16, "C" is specific heat (J/kgK) of the refrigerant 16, and "ρ" is a density (kg/m³) of the refrigerant 16. In a case of Fluorinert (FC-43) of 3M Company, the specific heat C is 1050 J/kgK, and the density ρ is 1880 kg/m³.

A difference ΔT (° C.) between the temperature of the air supplied to the air-cooling tank 12 and the temperature of the air emitted from the air-cooling tank 12 may be calculated based on the above-mentioned Expression (1).

In this regard, however, "W" is the amount of heat generation (=power consumption (W)) of storage bricks 18, "L" is a flow rate (liters (Ls)/min) of the air, "C" is specific heat (J/kgK) of the air, and "ρ" is a density (kg/m³) of the air. The specific heat of the air is 1006 J/kgK, and the density ρ thereof is 1.166 kg/m³.

Hereinafter, advantages of the present embodiment will be described.

In the present embodiment, the storage bricks 18 are arranged within the air-cooling tank 12 and are cooled by cold air. Therefore, the general hard disks 18b in each of which a chassis includes vent holes may be used as storages. Accordingly, a construction cost of the information processing system 10 may be reduced.

Since no storage bricks 18 are arranged in the liquid immersion tank 11, it is possible to reduce the volume of the liquid immersion tank 11 at that rate. In general, a refrigerant used for the liquid immersion cooling method is expensive. Therefore, by reducing a usage amount of the refrigerant, it is possible to further reduce the construction cost of the information processing system 10 and to reduce a running cost.

Furthermore, in the present embodiment, heat generated by the storage bricks 18 in the air-cooling tank 12 is recovered by the refrigerant 16. If no cooling coil 25b exists, heat generated by the storage bricks 18 is emitted into the room without change and turns out to be recovered by the package air conditioner. In that case, in order to recover the heat generated by the storage bricks 18, the package air conditioner consumes relatively large electric power. On the other hand, in the present embodiment, the cooling coil 25b recovers the heat generated by the storage bricks 18. Therefore, a load on the package air conditioner is reduced, and an electric power consumption amount is decreased. Accordingly, compared with a case where no cooling coil 25b exists, a profound effect on energy saving is achieved.

Furthermore, since no storage bricks 18 are immersed in the refrigerant 16, the present embodiment has an advantage that it is easy to perform a maintenance work of the storage bricks 18.

Second Embodiment

Figure 7:
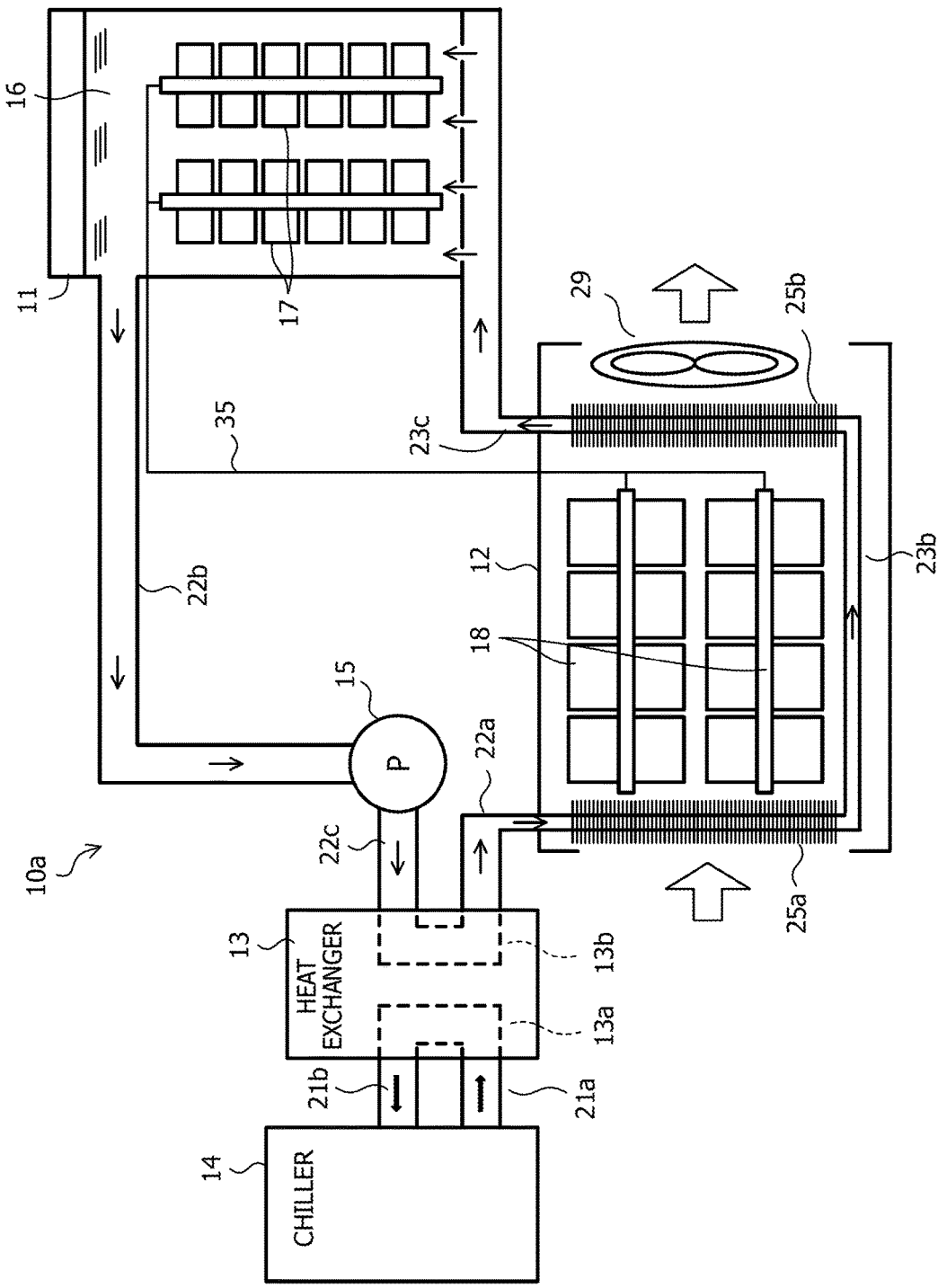
FIG. 7 is a pattern diagram illustrating an information processing system according to a second embodiment.

FIG. 7 is a pattern diagram illustrating an information processing system according to a second embodiment. In FIG. 7, the same symbol is assigned to the same as that in FIG. 1, and a detailed description thereof will be omitted.

In the first embodiment illustrated in FIG. 1, part of the refrigerant 16 supplied via the pipe 22a cools the server bricks 17 within the liquid immersion tank 11. In addition, a remaining part of the refrigerant 16 cools the storage bricks 18 within the air-cooling tank 12. In addition, these refrigerants 16 join and flow through the pipe 22b. Accordingly, in the first embodiment, it may be said that the liquid immersion tank 11 and the air-cooling tank 12 are coupled in parallel between the pipe 22a and the pipe 22b. The pipe 22a is an example of a first pipe. The pipe 22b is an example of a second pipe.

In contrast, in the second embodiment, the liquid immersion tank 11 and the air-cooling tank 12 are coupled in series between the pipe 22a and the pipe 22b.

In other words, as illustrated in FIG. 7, in an information processing system 10a according to the present embodiment, the refrigerant outlet of the heat exchanger 13 and the refrigerant inlet of the cooling coil 25a of the air-cooling tank 12 are coupled to each other by the pipe 22a. The refrigerant outlet of the cooling coil 25a and the refrigerant inlet of the cooling coil 25b are coupled to each other by the pipe 23b. The refrigerant outlet of the cooling coil 25b and one of the refrigerant inlets of the liquid immersion tank 11 are coupled to each other by the pipe 23c.

Furthermore, the refrigerant outlet of the liquid immersion tank 11 and the suction opening (suction) of the pump 15 are coupled to each other by the pipe 22b. The discharge opening (delivery) of the pump 15 and the refrigerant inlet of the heat exchanger 13 are coupled to each other by the pipe 22c.

Hereinafter, an operation of the information processing system 10a according to the present embodiment will be described.

The refrigerant 16 cooled by the heat exchanger 13 is supplied to the air-cooling tank 12 via the pipe 22a.

In the air-cooling tank 12, air in the room is introduced from a cooling coil 25a side into the air-cooling tank 12 by the blower 29. At a time of passing through the cooling coil 25a, the air introduced into the air-cooling tank 12 is cooled by the refrigerant 16 flowing through the cooling coil 25a.

In the air-cooling tank 12, heat is generated along with operations of the storage bricks 18, and the temperatures of the respective storage bricks 18 rise. However, the storage bricks 18 are cooled by the air flowing through the air-cooling tank 12. Therefore, temperatures of electronic components (the hard disks 18b) within the storage bricks 18 are maintained at temperatures lower than the respective allowable upper-limit temperatures.

The air the temperature of which rises due to cooling the storage bricks 18 is emitted into the room via the cooling coil 25b. At a time when the air passes through the cooling coil 25b, the air is cooled by the refrigerant 16 that flows through the cooling coil 25b. Therefore, the temperature of the air emitted from the air-cooling tank 12 into the room becomes about 21° C., for example.

On the other hand, the refrigerant 16 after passing through the cooling coil 25b enters the liquid immersion tank 11 via the pipe 23c next. In the liquid immersion tank 11, heat is generated along with operations of the server bricks 17, and the temperatures of the respective server bricks 17 rise. However, the server bricks 17 are cooled by the refrigerant 16 that moves from the bottom to the top within the liquid immersion tank 11. Therefore, temperatures of electronic components (the CPUs 32 and so forth) within the server bricks 17 are maintained at temperatures lower than respective allowable upper-limit temperatures.

The refrigerant 16 the temperature of which rises due to cooling the server bricks 17 returns to the heat exchanger 13 via the pipe 22b, the pump 15, and the pipe 22c. The refrigerant 16 is cooled by the cooling water that flows through the cooling water flow path 13a, and is supplied to the air-cooling tank 12 via the pipe 22a again.

In the present embodiment, the same advantages as those of the first embodiment may be obtained. In a case of coupling tanks (the liquid immersion tank 11 and the air-cooling tank 12) in series like the present embodiment, it is desirable that the refrigerant 16 flows in order starting from a tank having a smaller amount of heat generation.

Third Embodiment

Figure 8:
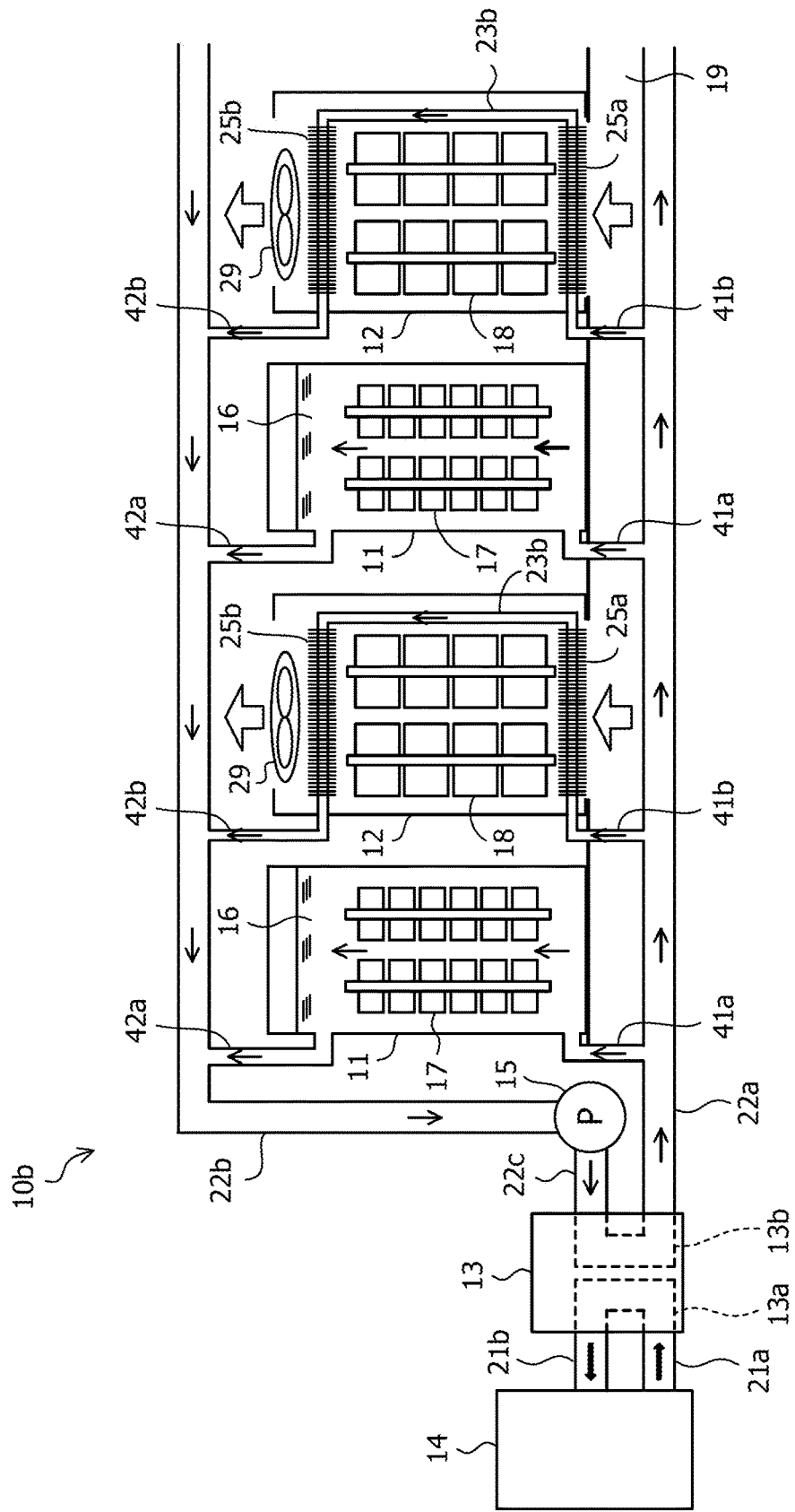
FIG. 8 is a pattern diagram illustrating an information processing system according to a third embodiment.

FIG. 8 is a pattern diagram illustrating an information processing system according to a third embodiment. In FIG. 8, the same symbol is assigned to the same as that in FIG. 1, and a description of the redundant portion will be omitted. In FIG. 8, an illustration of the cable 35 (see FIG. 1) for coupling the server bricks 17 and the storage bricks 18 is omitted.

In an information processing system 10b illustrated in FIG. 8, the liquid immersion tanks 11 and the air-cooling tanks 12 are included. The server bricks 17 are each arranged in a state of being immersed in the refrigerant 16 in each of the liquid immersion tanks 11, and the storage bricks 18 and the cooling coils 25a and 25b are arranged in each of the air-cooling tanks 12.

In a bottom portion of each of the air-cooling tanks 12, a hole into the free space 19 is provided, and the corresponding blower 29 supplies low-temperature air from the free space 19 into the relevant air-cooling tank 12.

In the same way as in the first embodiment, the refrigerant outlet of the heat exchanger 13 is coupled to the pipe 22a. The suction opening of the pump 15 is coupled to the pipe 22b. The discharge opening is coupled to the refrigerant inlet of the heat exchanger 13 via the pipe 22c.

A refrigerant inlet provided in a lower portion of each of the liquid immersion tanks 11 is coupled to the pipe 22a via a pipe 41a. The cooling coil 25a located on a lower side of each of the air-cooling tanks 12 is coupled to the pipe 22a via a pipe 41b. Furthermore, the refrigerant outlet located in the upper portion of each of the liquid immersion tanks 11 is coupled to the pipe 22b via a pipe 42a. The cooling coil 25b located on an upper side of each of the air-cooling tanks 12 is coupled to the pipe 22b via a pipe 42b.

In the present embodiment, the liquid immersion tanks 11 and the air-cooling tanks 12 are coupled in parallel between the pipe 22a and the pipe 22b. In addition, the low-temperature refrigerant 16 is supplied to the liquid immersion tanks 11 and the air-cooling tanks 12 via the pipe 22a, and the high-temperature refrigerant 16 is recovered from the liquid immersion tanks 11 and the air-cooling tanks 12 via the pipe 22b. For this reason, it is possible to effectively cool the server bricks 17 within each of the liquid immersion tanks 11 and the storage bricks 18 within each of the air-cooling tanks 12.

Example of Modification

Figure 9:
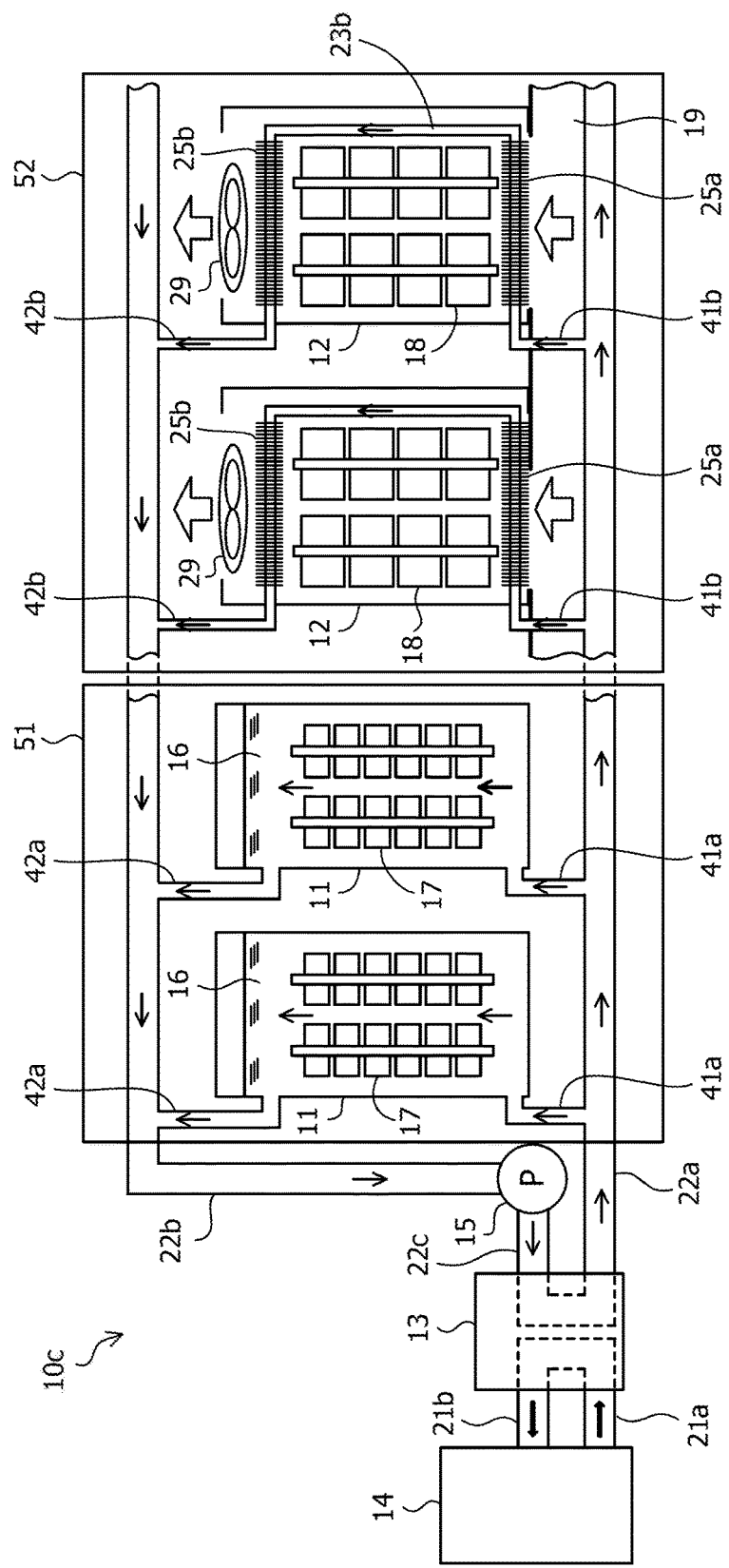
FIG. 9 is a pattern diagram illustrating an example of a modification to the third embodiment.

FIG. 9 is a pattern diagram illustrating an example of a modification to the third embodiment.

In a case where the liquid immersion tanks 11 and the air-cooling tanks 12 are arranged in the same room, vapor of the refrigerant 16 is generated from the liquid immersion tanks 11. In addition, the generated vapor enters the hard disks 18b within the air-cooling tanks 12 and is attached to surfaces of disks. There is a possibility that the attached vapor causes failures of the hard disks 18b.

In an information processing system 10c illustrated in FIG. 9, the liquid immersion tanks 11 are arranged in a first room 51, and the air-cooling tanks 12 are arranged in a second room 52.

In other words, in the example of a modification illustrated in FIG. 9, a space in which the liquid immersion tanks 11 are arranged and a space in which the air-cooling tanks 12 are arranged are physically separated. For this reason, it is possible to avoid failures of the hard disks 18b, caused by the vapor of the refrigerant 16.

Fourth Embodiment

Figure 10:
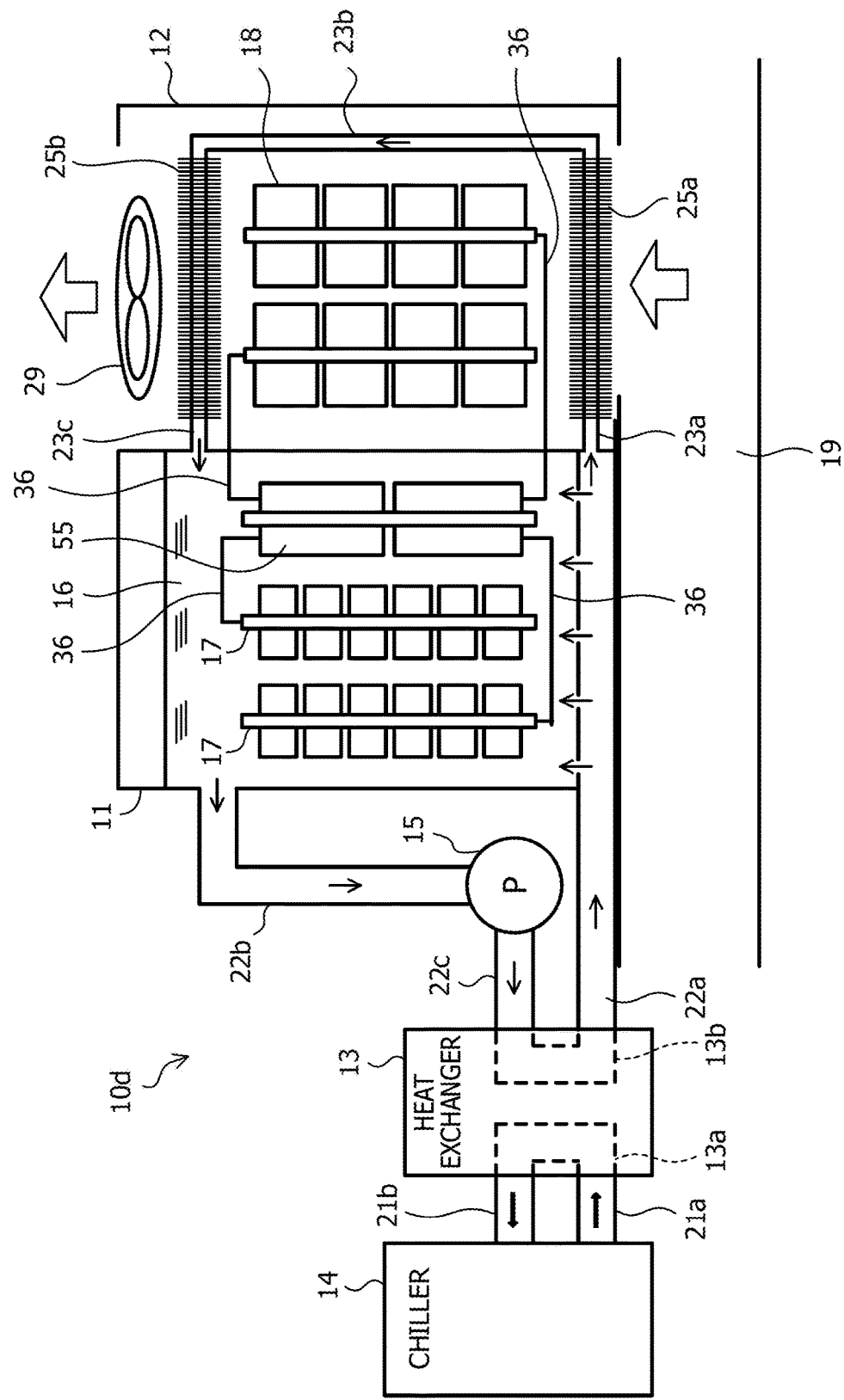
FIG. 10 is a pattern diagram illustrating an information processing system according to a fourth embodiment.

FIG. 10 is a pattern diagram illustrating an information processing system according to a fourth embodiment. In FIG. 10, the same symbol is assigned to the same as that in FIG. 1, and a description of the redundant portion will be omitted. In FIG. 10, an illustration of the cable 35 (see FIG. 1) for coupling the server bricks 17 and the storage bricks 18 is omitted.

In an information processing system 10d according to the present embodiment, the server bricks 17 and power supply units (PSUs) 55 are immersed in the refrigerant 16 within the liquid immersion tank 11. In addition, by using cables 36, the PSUs 55 supplies electric power to the server bricks 17 and the storage bricks 18 within air-cooling tank 12.

The PSUs 55 each generate heat along with an operation thereof. In a case where the amount of heat generation of the PSUs 55 is large, it is desirable that the PSUs 55 are arranged within the liquid immersion tank 11 and are cooled by the refrigerant 16 in the same way as in the present embodiment.

In a case where the amount of heat generation of the PSUs 55 is not so large, the PSUs 55 may be arranged within the air-cooling tank 12. The PSU 55 may be arranged in each of the liquid immersion tank 11 and the air-cooling tank 12, the PSU 55 within the liquid immersion tank 11 may supply electric power to the server bricks 17 within the liquid immersion tank 11, and the PSU 55 within the air-cooling tank 12 may supply electric power to the storage bricks 18 within the air-cooling tank 12.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing system, comprising:
a chiller configured to cool a primary refrigerant;
a liquid immersion tank in which a processing device including a first electronic component is immersed in a secondary refrigerant;
a second electronic component coupled to the processing device;
a blower configured to blow or inhale air for the second electronic component;
a coil in which the secondary refrigerant is cooled by the air;
an air tank that is coupled to the coil and that includes a refrigerant pipe through which the secondary refrigerant flows;
a heat exchanger configured to exchange heat between the primary refrigerant and the secondary refrigerant; and
a pump configured to circulate the secondary refrigerant from the liquid immersion tank to the heat exchanger.

2. The information processing system according to claim 1,
wherein the liquid immersion tank and the air tank are coupled in parallel between a first pipe through which the secondary refrigerant that comes out from the heat exchanger flows and a second pipe through which the secondary refrigerant to return to the heat exchanger flows.

3. The information processing system according to claim 1,
wherein the liquid immersion tank and the air tank are coupled in series between a first pipe through which the secondary refrigerant that comes out from the heat exchanger flows and a second pipe through which the secondary refrigerant to return to the heat exchanger flows.

4. The information processing system according to claim 1,
wherein the second electronic component has lower liquid immersion resistance than that of the first electronic component.

5. The information processing system according to claim 1,
wherein, at a time of passing through the coil, the air is cooled by the secondary refrigerant flowing through the coil.

6. The information processing system according to claim 3, wherein
the coil includes a first coil configured to cool the air before the air is blown to the second electronic component and a second coil configured to cool the air after the air is blown to the second electronic component, and the first coil covers the first pipe, and the second coil covers the second pipe.

7. The information processing system according to claim 6, wherein the secondary refrigerant that passes through the second coil flows through the second pipe and enters the liquid immersion tank, joins the secondary refrigerant that cools the first electronic component, and moves from the liquid immersion tank to the heat exchanger via the pump.

8. The information processing system according to claim 7, wherein the secondary refrigerant that enters the heat exchanger is cooled by the primary refrigerant.

9. The information processing system according to claim 3, wherein the secondary refrigerant that comes out from the heat exchanger flows through the first pipe and is supplied to the liquid immersion tank and the air tank.

10. A control method executed by an information processing system including a chiller configured to cool a primary refrigerant, a liquid immersion tank in which a processing device including a first electronic component is immersed in a secondary refrigerant, a second electronic component coupled to the processing device, and an air tank that is coupled to a coil and that includes a refrigerant pipe through which the secondary refrigerant flows, the control method comprising:

blowing or inhaling air for the second electronic component, by using a blower included in the information processing system;

cooling the secondary refrigerant by use of the air, by using the coil;

exchanging heat between the primary refrigerant and the secondary refrigerant, by using a heat exchanger included in the information processing system; and circulating the secondary refrigerant from the liquid immersion tank to the heat exchanger, by using a pump included in the information processing system.

11. The control method according to claim 10, wherein the liquid immersion tank and the air tank are coupled in parallel between a first pipe through which the secondary refrigerant that comes out from the heat exchanger flows and a second pipe through which the secondary refrigerant to return to the heat exchanger flows.

12. The control method according to claim 10, wherein the liquid immersion tank and the air tank are coupled in series between a first pipe through which the secondary refrigerant that comes out from the heat exchanger flows and a second pipe through which the secondary refrigerant to return to the heat exchanger flows.

13. The control method according to claim 10, wherein the second electronic component has lower liquid immersion resistance than that of the first electronic component.

14. The control method according to claim 10, wherein, at a time of passing through the coil, the air is cooled by the secondary refrigerant flowing through the coil.

* * * * *